United States Patent
Liang et al.

(10) Patent No.: US 7,843,694 B2
(45) Date of Patent: Nov. 30, 2010

(54) HEAT-DISSIPATING MODULE AND ELECTRONIC DEVICE HAVING THE SAME

(75) Inventors: Chuan Yi Liang, Taipei Hsien (TW); Ming Chang Wu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 12/417,343

(22) Filed: Apr. 2, 2009

(65) Prior Publication Data
US 2010/0079952 A1  Apr. 1, 2010

(30) Foreign Application Priority Data
Sep. 26, 2008  (TW) .............................. 97217456 U

(51) Int. Cl.
*H05K 7/20* (2006.01)
(52) U.S. Cl. ...................... 361/700; 361/699; 361/719; 165/80.4; 165/104.33; 257/715; 174/15.1
(58) Field of Classification Search .................. None
See application file for complete search history.

(56) References Cited

U.S. PATENT DOCUMENTS

| | | | |
|---|---|---|---|
| 6,443,222 B1 * | 9/2002 | Yun et al. | 165/104.26 |
| 6,525,934 B1 * | 2/2003 | Nakanishi et al. | 361/679.47 |
| 6,705,089 B2 * | 3/2004 | Chu et al. | 62/3.2 |
| 7,177,007 B2 * | 2/2007 | Emoto | 355/30 |
| 7,548,427 B2 * | 6/2009 | Mongia | 361/700 |
| 2006/0185826 A1 * | 8/2006 | Ohashi | 165/104.24 |
| 2007/0034356 A1 * | 2/2007 | Kenny et al. | 165/80.4 |

* cited by examiner

*Primary Examiner*—Boris L Chervinsky
(74) *Attorney, Agent, or Firm*—Stephen A. Bent; Foley & Lardner LLP

(57) ABSTRACT

An electronic device having a heat-dissipating module includes a housing and an electronic component (e.g., a central processing unit) disposed within the housing. The heat-dissipating module is used for dissipating heat of the electronic component, and includes a two-phase flow heat-dissipating loop and a thermoelectric cooling component. The two-phase flow heat-dissipating loop can be a loop heat pipe (LHP) or a capillary pumped loop (CPL). The thermoelectric cooling component includes a cooling portion and a heat-generating portion respectively to cool or heat necessary portions of the two-phase flow heat-dissipating loop, or directly cool the electronic component through the cooling portion, thereby increasing the heat-dissipation effect of the two-phase flow heat-dissipating loop.

7 Claims, 4 Drawing Sheets

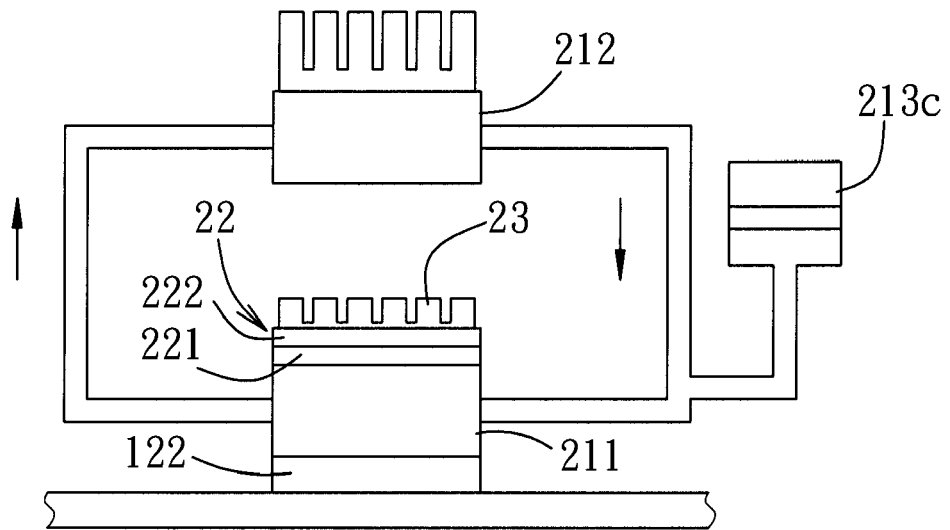
F I G. 5
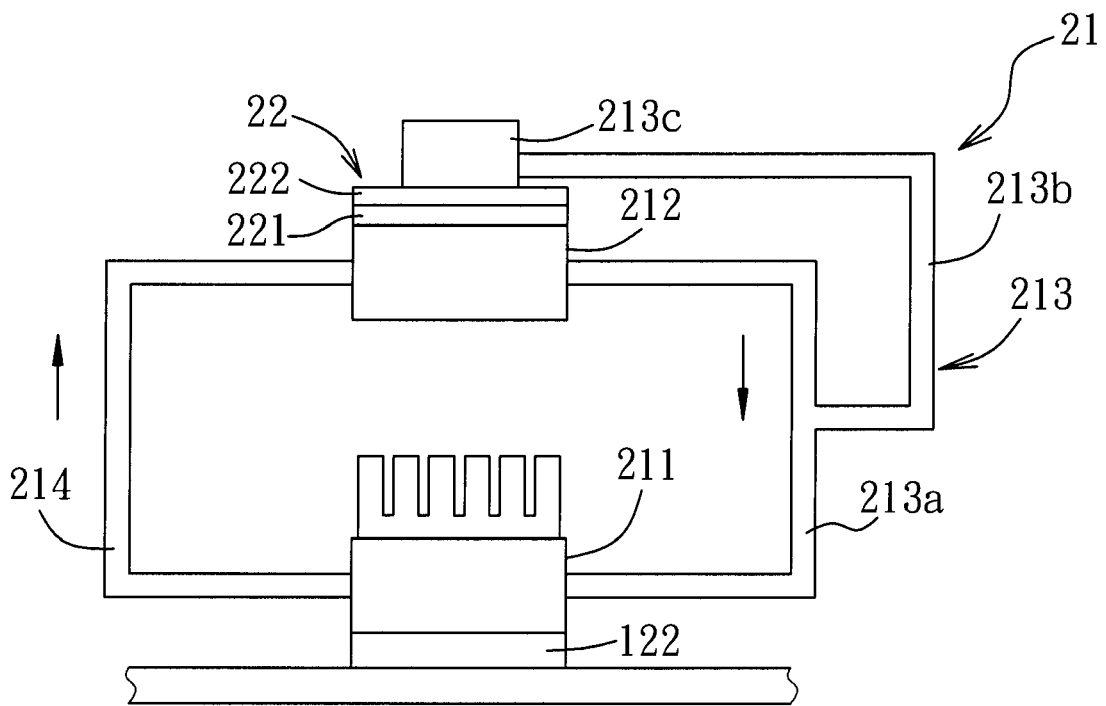
F I G. 6

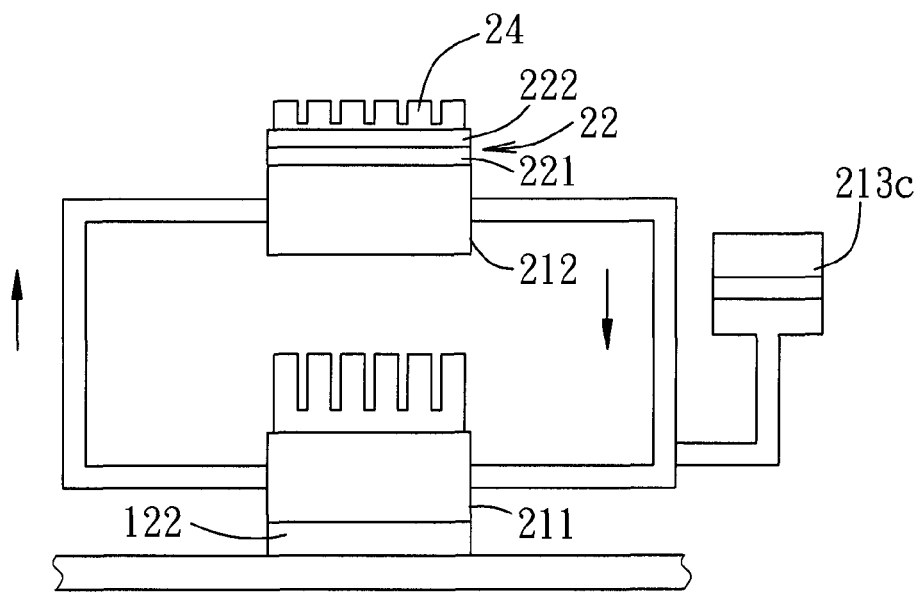
F I G. 7
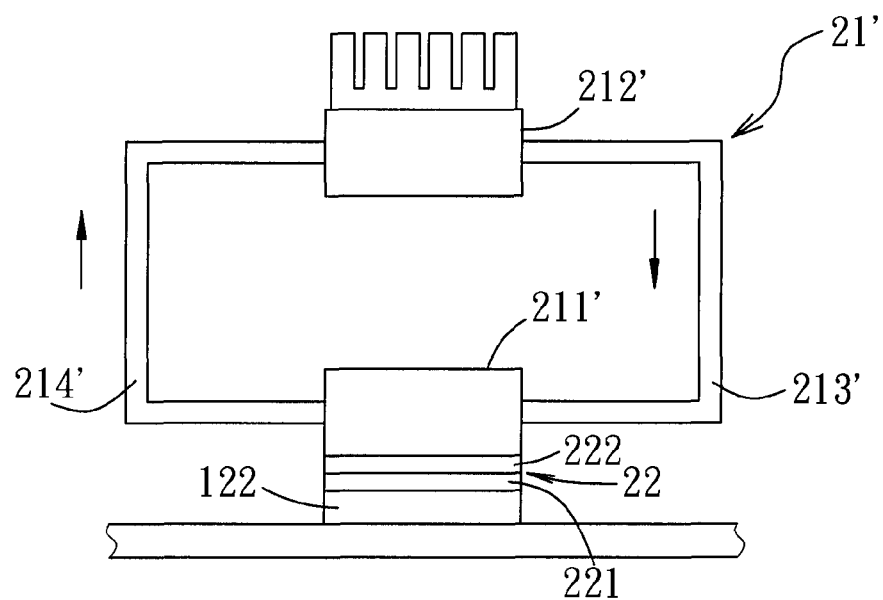
F I G. 8

HEAT-DISSIPATING MODULE AND ELECTRONIC DEVICE HAVING THE SAME

CROSS-REFERENCE TO RELATED APPLICATION

This application claims priority of Taiwanese Application No. 097217456, filed on Sep. 26, 2008.

BACKGROUND OF THE INVENTION

1. Field of the Invention

The invention relates to a heat-dissipating module and an electronic device having the heat-dissipating module, more particularly to a heat-dissipating module that dissipates heat using a two-phase flow heat-dissipating loop and to an electronic device having the heat-dissipating module.

2. Description of the Related Art

Referring to FIG. 1, a two-phase flow heat-dissipating loop 8 of a loop heat pipe (LHP) type includes a circulating loop 81 for a work fluid to flow therein, and an evaporating portion 82 and a condensing portion 83 provided on the circulating loop 81.

The working principle of the two-phase flow heat-dissipating loop 8 is to provide the evaporating portion 82 at a heat-generating source (not shown). The liquid work fluid absorbs heat energy from the heat-generating source via the evaporating portion 82 so as to be vaporized when it flows through the evaporating portion 82. The vaporized work fluid then flows out of the evaporating portion 82 and flows into the condensing portion 83. The vaporized work fluid is condensed to a liquid state via the condensing portion 83 which removes the latent heat of vaporization therefrom, thereby completing a cycle of dissipating the heat from the heat-generating source.

Referring to FIG. 2, a two-phase flow heat-dissipating loop 9 of a capillary pumped loop (CPL) type includes a circulating loop 91 for a work fluid to flow therein, an evaporating portion 92 and a condensing portion 93 provided on the circulating loop 91, and a liquid reservoir 94 connected to the circulating loop 91. The manner of heat-dissipation of the two-phase flow heat-dissipating loop 9 of the CPL type is substantially identical to that of the two-phase flow heat-dissipating loop 8 of the LHP type of FIG. 1 except that, in the two-phase flow heat-dissipating loop 9, the heat-dissipating cycle is actuated via heating the work fluid in the liquid reservoir 94.

When the aforesaid heat-dissipating loops 8, 9 are used to dissipate the heat of the heat-generating source, the evaporating portions 82, 92 and the condensing portions 83, 93 are generally provided with heat-dissipating structures 84, 95 (e.g., a fin type heat sink) having a relatively complicated configuration in order to dissipate the surplus heat absorbed by the evaporating portions 82, 92 and the condensing portions 83, 93. However, since the manner of heat-dissipation of the heat-dissipating structures 84, 95 are relatively passive, their heat-dissipating effects on the evaporating portions 82, 92 and the condensing portions 83, 93 are relatively difficult to control. Furthermore, because the heat dissipation is of a passive type, in order to achieve an expected heat-dissipating effect, the heat-dissipating structures 84, 95 are relatively complicated and large-sized. Therefore, there may be a problem of increased costs of heat-dissipation.

SUMMARY OF THE INVENTION

Therefore, an object of the present invention is to provide a heat-dissipating module combining a thermoelectric cooling device and a two-phase flow heat-dissipating loop, and an electronic device having the heat-dissipating module.

Another object of the present invention is to provide a heat-dissipating module that conducts active cooling of a two-phase flow heat-dissipating loop so as to better control the cooling effect, and an electronic device having the heat-dissipating module.

Accordingly, the heat-dissipating module of the present invention includes a two-phase flow heat-dissipating loop and a thermoelectric cooling component. The two-phase flow heat-dissipating loop includes a condensing portion, an evaporating portion, a liquid-phase pipe assembly, and a gas-phase pipe assembly. The liquid-phase pipe assembly interconnects the condensing portion and the evaporating portion for a work fluid to flow therein, and the gas-phase pipe assembly interconnects the condensing portion and the evaporating portion for the work fluid to flow therein. The thermoelectric cooling component includes a cooling portion and a heat-generating portion. The cooling portion of the thermoelectric cooling component is disposed on one of the condensing portion and the evaporating portion so as to cool said one of the condensing portion and the evaporating portion.

The electronic device having a heat-dissipating module of the present invention includes a housing, a circuit unit disposed within the housing, and the heat-dissipating module. The circuit unit includes a circuit board and an electronic component (e.g., a central processing unit (CPU)) disposed on the circuit board. The evaporating portion is disposed on the electronic component. The heat-dissipating module dissipates the heat of the electronic component by disposing the evaporating portion on the electronic component.

Preferably, the two-phase flow heat-dissipating loop is a loop heat pipe (LHP), and conducts active cooling of the evaporating portion or the condensing portion by disposing the cooling portion on the evaporating portion or the condensing portion of the two-phase flow heat-dissipating loop.

Preferably, the two-phase flow heat-dissipating loop is a capillary pumped loop (CPL), and the liquid-phase pipe assembly includes a liquid reservoir. The thermoelectric cooling component may be disposed between the liquid reservoir and the evaporating portion to heat the liquid reservoir through the heat-generating portion and to conduct active cooling of the evaporating portion through the cooling portion.

The thermoelectric cooling component may be also disposed between the liquid reservoir and the condensing portion to heat the liquid reservoir through the heat-generating portion and to conduct active cooling of the condensing portion through the cooling portion.

The electronic device having a heat-dissipating module of the present invention includes a housing, a circuit unit disposed within the housing, and the heat-dissipating module. The circuit unit includes a circuit board and an electronic component (e.g., a central processing unit (CPU)) disposed on the circuit board. The cooling portion of the thermoelectric cooling component is disposed on the electronic component for cooling the electronic component. The heat-generating portion is disposed on the evaporating portion for heating the evaporating portion.

The present invention combines the two-phase flow heat-dissipating loop with the thermoelectric cooling component for use in the dissipation of heat from, for example, the central processing unit or other chip modules in a computer device. By using the cooling portion and the heat-generating portion of the thermoelectric cooling component to cool or heat necessary portions of the two-phase flow heat-dissipating loop, the two-phase flow heat-dissipating loop can achieve better cooling effects compared to the prior art.

BRIEF DESCRIPTION OF THE DRAWINGS

Other features and advantages of the present invention will become apparent in the following detailed description of the preferred embodiments with reference to the accompanying drawings, of which:

FIG. 5 illustrates a modification of the heat-dissipating module of the first preferred embodiment;

FIG. 6 is a schematic diagram of a heat-dissipating module of a second preferred embodiment of an electronic device according to this invention;

FIG. 7 illustrates a modification of the heat-dissipating module of the second preferred embodiment; and FIG. 8 is a schematic diagram of a heat-dissipating module of a third preferred embodiment of an electronic device according to this invention.

DETAILED DESCRIPTION OF THE PREFERRED EMBODIMENTS

Figure 1:
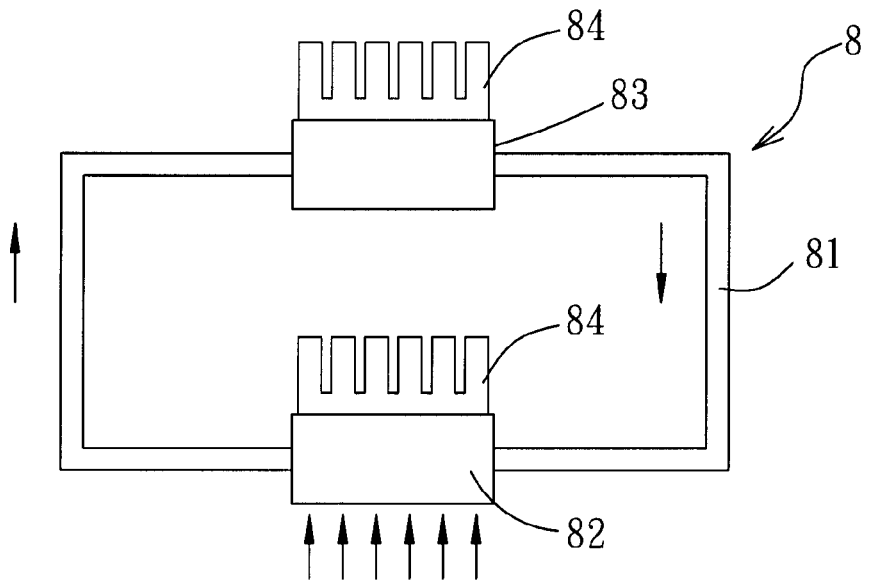
FIG. 1 is a schematic diagram of a conventional two-phase flow heat-dissipating loop of a LHP type.
Figure 2:
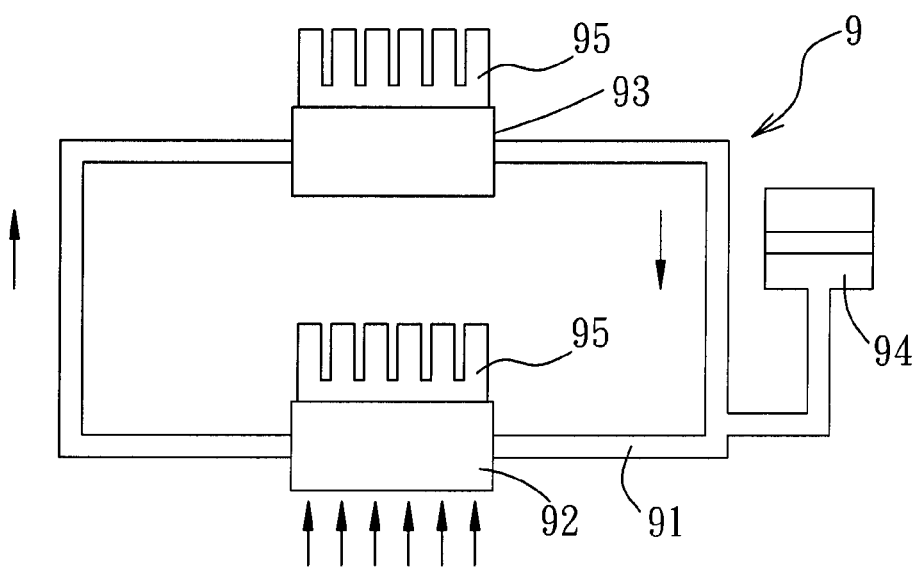
FIG. 2 is a schematic diagram of a conventional two-phase flow heat-dissipating loop of a CPL type.

Before the present invention is described in greater detail, it should be noted that like elements are denoted by the same reference numerals throughout the disclosure.

Figure 3:
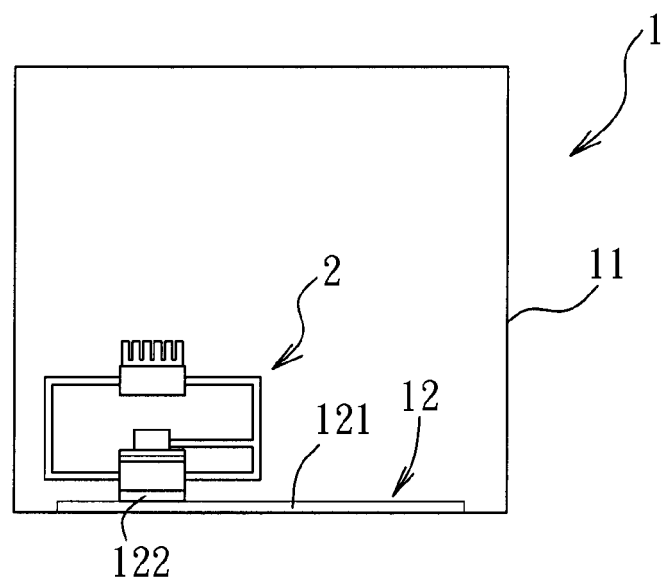
FIG. 3 is a schematic diagram of a first preferred embodiment of an electronic device according to this invention.
Figure 4:
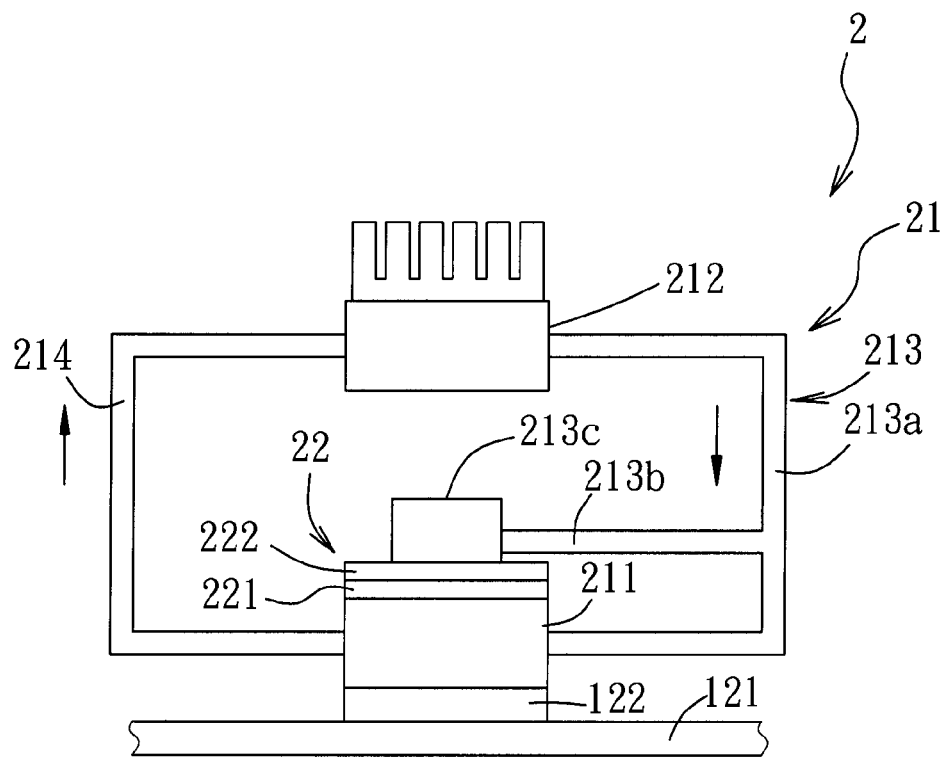
FIG. 4 is a schematic diagram of a heat-dissipating module of the first preferred embodiment.

Referring to FIGS. 3 and 4, the first preferred embodiment of an electronic device 1 including a heat-dissipating module according to this invention includes a housing 11, a circuit unit 12 disposed within the housing 11, and a heat-dissipating module 2.

The housing 11 of this preferred embodiment may be a housing for a computer device or any other electronic device. The circuit unit 12 includes a circuit board 121 disposed within the housing 11, and an electronic component 122 disposed on the circuit board 121. The electronic component 122 referred to herein is a central processing unit (CPU). However, it can be any other electronic component that generates heat in a working state and therefore requires heat dissipation, such as a chip module.

The heat-dissipating module 2 includes a two-phase flow heat-dissipating loop 21 and a thermoelectric cooling component 22.

The two-phase flow heat-dissipating loop 21 includes an evaporating portion 211, a condensing portion 212, a liquid-phase pipe assembly 213, and a gas-phase pipe assembly 214. The liquid-phase pipe assembly 213 interconnects the evaporating portion 211 and the condensing portion 212, and the gas-phase pipe assembly 214 interconnects the evaporating portion 211 and the condensing portion 212. In this embodiment, the two-phase flow heat-dissipating loop 21 is a capillary pumped loop (CPL). The gas-phase pipe assembly 214 is a pipe interconnecting the evaporating portion 211 and the condensing portion 212. The liquid-phase pipe assembly 213 includes a first flow passage (213a), a second flow passage (213b), and a liquid reservoir (213c) The first flow passage (213a) interconnects the evaporating portion 211 and the condensing portion 212, and is connected to the gas-phase pipe assembly 214 so as to form a closed loop for a work fluid to flow therein. The second flow passage (213b) is connected to the first flow passage (213a) at one end thereof. The liquid reservoir (213c) is disposed at the other end of the second flow passage (213b). The evaporating portion 211 and the condensing portion 212 are each located at a junction where an end of the first flow passage (213a) is connected to an end of the gas-phase pipe assembly 214. The evaporating portion 211 is disposed on the electronic component 122, and may be secured around the electronic component 122 by threaded engagement, snap engagement, or other physical connection means. Preferably, an outer surface of the evaporating portion 211 is brought into contact with an outer surface of the electronic component 122.

When the evaporating portion 211 of the two-phase flow heat-dissipating loop 21 is disposed on the electronic component 122, the heat energy of the electronic component 122 can be absorbed by the work fluid flowing through the evaporating portion 211 to be dissipated via the condensing portion 212 so that the two-phase flow heat-dissipating loop 21 has a heat-dissipating effect on the electronic component 122.

The thermoelectric cooling component 22 in this embodiment is a thermoelectric cooler (TEC), and includes a cooling portion 221 and a heat-generating portion 222. In this preferred embodiment, the thermoelectric cooling component 22 is disposed between the liquid reservoir (213c) and the evaporating portion 211. The cooling portion 221 is in contact with the evaporating portion 211 to cool the evaporating portion 211 so as to remove excessive heat energy absorbed by the evaporating portion 211 and so as to avoid over-heating of the evaporating portion 211. The heat-generating portion 222 is in contact with the liquid reservoir (213c) so as to preheat the liquid work fluid in the liquid reservoir (213c) to thereby maintain the circulation power for the whole heat-dissipating loop 21.

It is apparent from the foregoing that, by combining the two-phase flow heat-dissipating loop 21 and the thermoelectric cooling component 22, the cooling portion 221 of the thermoelectric cooling component 22 can be used to cool the evaporating portion 211 to achieve a better heat-dissipating effect as compared to the use of the heat-dissipating structure to conduct passive cooling in the prior art since the cooling portion 221 actively dissipates the heat of the evaporating portion 211, so that it is not necessary to additionally provide other heat-dissipating structures (such as a fin type heat sink) for the evaporating portion 211, thereby reducing the cost of heat-dissipation in this respect. In addition, the heat-generating portion 222 of the thermoelectric cooling component 22 can be used to preheat the liquid reservoir (213c) simultaneously, so that the circulation power for the heat-dissipating loop 21 can be maintained, and the temperature for preheating the liquid reservoir (213c) can be better controlled.

Referring to FIG. 5, a modification of the first preferred embodiment is illustrated, in which the cooling portion 221 of the thermoelectric cooling component 22 is disposed on the evaporating portion 211 of the two-phase flow heat-dissipating loop 21 so as to conduct active cooling of the evaporating portion 211. As compared to the prior art which conducts passive heat-dissipation via a heat-dissipating structure, this modified embodiment can likewise achieve similar cooling effects. In addition, in this modified embodiment, the electronic device may further comprise a fin type heat sink 23 that is disposed on the heat-generating portion 222 of the thermoelectric cooling component 22 and that has a relatively simple configuration to dissipate the heat of the thermoelectric cooling component 22.

Referring to FIG. 6, the second preferred embodiment of this invention includes components substantially identical to those of the first preferred embodiment except that, in the second preferred embodiment, the cooling portion 221 of the thermoelectric cooling component 22 is disposed on the condensing portion 212 of the two-phase flow heat-dissipating loop 21 to be in contact with the condensing portion 212 so as to conduct active cooling of the condensing portion 212, thereby enabling the condensing portion 212 to attain a better condensation effect. The heat-generating portion 222 of the thermoelectric cooling component 22 is likewise disposed on the liquid reservoir (213c) of the two-phase flow heat-dissipating loop 21 to preheat the liquid reservoir (213c) so as to maintain the circulation power.

Referring to FIG. 7, a modification of the second preferred embodiment is illustrated, in which the cooling portion 221 of the thermoelectric cooling component 22 is disposed on the condensing portion 212 of the two-phase flow heat-dissipating loop 21 so as to absorb surplus heat from the condensing portion 212. Furthermore, in this modification, the electronic device 1 may further comprise a fin type heat sink 24 that is disposed on the heat-generating portion 222 of the thermoelectric cooling component 22 and that has a relatively simple configuration to dissipate the heat of the thermoelectric cooling component 22.

Referring to FIG. 8, the third preferred embodiment of this invention differs from the previous two preferred embodiments in the positions of the cooling portion 221 and the heat-generating portion 222 of the thermoelectric cooling component 22 in the two-phase flow heat-dissipating loop 21'.

In the third preferred embodiment, the two-phase flow heat-dissipating loop 21' is a loop heat pipe (LHP), and includes an evaporating portion 211', a condensing portion 212', a liquid-phase pipe assembly 213', and a gas-phase pipe assembly 214'. The liquid-phase pipe assembly 213' interconnects the evaporating portion 211' and the condensing portion 212', and the gas-phase pipe assembly 214' interconnects the evaporating portion 211' and the condensing portion 212'. In this embodiment, both of the liquid-phase pipe assembly 213' and the gas-phase pipe assembly 214' are pipes, and are fluidly connected to each other to form a closed loop.

The cooling portion 221 of the thermoelectric cooling component 22 is disposed on the electronic component 122 to directly reduce the temperature of the electronic component 122, whereas the heat-generating portion 222 of the thermoelectric cooling component 22 is disposed in contact with the evaporating portion 211'. Since there is no liquid reservoir in the LHP, in this embodiment, the heat-generating portion 222 of the thermoelectric cooling component 22 is used to directly heat the evaporating portion 211' so as to maintain the circulation power for the whole heat-dissipating loop 21'. Furthermore, the arrangement of the cooling portion 221 of the thermoelectric cooling component 22 on the electronic component 122 permits direct active cooling of the electronic component 122.

It should be mentioned that the arrangements of the thermoelectric cooling component 22 as shown in FIGS. 5 and 7 (i.e., using only the cooling portion 221 to cool the condensing portion 212 or the evaporating portion 211) can also be applied to the evaporating portion 211' or the condensing portion 212' of the LHP.

In sum, the present invention combines the two-phase flow heat-dissipating loop 21,21' with the thermoelectric cooling component 22 for use in the dissipation of heat from the central processing unit or other chip modules in a computer device. By using the cooling portion 221 and the heat-generating portion 222 of the thermoelectric cooling component 22 to cool or heat necessary portions of the two-phase flow heat-dissipating loop 21, 21', or by using the cooling portion 221 of the thermoelectric cooling component 22 to directly cool the electronic component 122, the two-phase flow heat-dissipating loop 21, 21' can achieve better cooling effects compared to the prior art.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A heat-dissipating module, comprising:
  a two-phase flow heat-dissipating loop including a condensing portion, an evaporating portion, a liquid-phase pipe assembly, and a gas-phase pipe assembly, said liquid-phase pipe assembly interconnecting said condensing portion and said evaporating portion for a work fluid to flow therein, and said gas-phase pipe assembly interconnecting said condensing portion and said evaporating portion for the work fluid to flow therein; and
  a thermoelectric cooling component including a cooling portion and a heat-generating portion, said cooling portion of said thermoelectric cooling component being disposed on one of said condensing portion and said evaporating portion so as to cool said one of said condensing portion and said evaporating portion, wherein said liquid-phase pipe assembly includes a first flow passage interconnecting said condensing portion and said evaporating portion, a second flow passage connected to said first flow passage at one end thereof, and a liquid reservoir disposed at the other end of said second flow passage, said heat-generating portion being disposed on said liquid reservoir for heating said liquid reservoir.

2. The heat-dissipating module as claimed in claim 1, wherein said thermoelectric cooling component is disposed between said liquid reservoir and said condensing portion, whereby said cooling portion of said thermoelectric cooling component is disposed on said condensing portion for cooling said condensing portion.

3. The heat-dissipating module as claimed in claim 1, wherein said thermoelectric cooling component is disposed between said liquid reservoir and said evaporating portion, whereby said cooling portion of said thermoelectric cooling component is disposed on said evaporating portion for cooling said evaporating portion.

4. An electronic device having a heat-dissipating module, comprising:
  a housing;
  a circuit unit disposed within said housing, and including a circuit board and an electronic component disposed on said circuit board; and
  a heat-dissipating module including
    a two-phase flow heat-dissipating loop that includes a condensing portion, an evaporating portion, a liquid-phase pipe assembly, and a gas-phase pipe assembly, said liquid-phase pipe assembly interconnecting said condensing portion and said evaporating portion for a work fluid to flow therein, said gas-phase pipe assembly interconnecting said condensing portion and said evaporating portion for the work fluid to flow therein, and said evaporating portion being disposed on said electronic component, and
    a thermoelectric cooling component including a cooling portion and a heat-generating portion, said cooling portion of said thermoelectric cooling component being disposed on one of said condensing portion and said evaporating portion for cooling said one of said condensing portion and said evaporating portion, wherein said liquid-phase pipe assembly includes a first flow passage interconnecting said condensing portion and said evaporating portion, a second flow passage connected to said first flow passage at one end thereof, and a liquid reservoir disposed at the other end of said second flow passage, said heat-generating portion being disposed on said liquid reservoir for heating said liquid reservoir.

5. The electronic device having a heat-dissipating module as claimed in claim 4, wherein said thermoelectric cooling component is disposed between said liquid reservoir and said condensing portion, whereby said cooling portion of said thermoelectric cooling component is disposed on said condensing portion for cooling said condensing portion.

6. The electronic device having a heat-dissipating module as claimed in claim 4, wherein said thermoelectric cooling component is disposed between said liquid reservoir and said evaporating portion, whereby said cooling portion of said thermoelectric cooling component is disposed on said evaporating portion for cooling said evaporating portion.

7. An electronic device having a heat-dissipating module, comprising:
   a housing;
   a circuit unit disposed within said housing, and including a circuit board and an electronic component disposed on said circuit board; and
   a heat-dissipating module including
      a two-phase flow heat-dissipating loop that includes a condensing portion, an evaporating portion, a liquid-phase pipe assembly, and a gas-phase pipe assembly, said liquid-phase pipe assembly interconnecting said condensing portion and said evaporating portion for a work fluid to flow therein, and said gas-phase pipe assembly interconnecting said condensing portion and said evaporating portion for the work fluid to flow therein, and
      a thermoelectric cooling component including a cooling portion and a heat-generating portion, said cooling portion of said thermoelectric cooling component being disposed on said electronic component for cooling said electronic component, said heat-generating portion being disposed on said evaporating portion for heating said evaporating portion.

* * * * *